United States Patent [19]

Kiyokawa et al.

[11] Patent Number: 6,019,564
[45] Date of Patent: Feb. 1, 2000

[54] SEMICONDUCTOR DEVICE TRANSPORTING AND HANDLING APPARATUS

[75] Inventors: Toshiyuki Kiyokawa, Kuki; Takao Murayama, Kumagaya, both of Japan

[73] Assignee: Advantest Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/735,742

[22] Filed: Oct. 23, 1996

[30] Foreign Application Priority Data

Oct. 27, 1995 [JP] Japan .................................. 7-280167
Oct. 30, 1995 [JP] Japan .................................. 7-281634

[51] Int. Cl.⁷ .................................................... B65H 11/00
[52] U.S. Cl. .......................... 414/223; 414/222; 414/225; 414/806; 414/416; 414/788.7
[58] Field of Search ................................ 414/222, 223, 414/225, 416, 417, 788.6, 788.7, 793.4, 796.7, 797, 797.3, 806

[56] References Cited

U.S. PATENT DOCUMENTS

| | | | |
|---|---|---|---|
| 3,432,049 | 3/1969 | Howells | 414/223 |
| 3,561,618 | 2/1971 | Lindbom | 414/223 |
| 4,375,126 | 3/1983 | Düll et al. | 414/796.7 |
| 4,389,272 | 6/1983 | Ferri et al. | 414/796.7 |
| 4,606,117 | 8/1986 | Takahashi et al. | 414/223 |
| 4,666,358 | 5/1987 | Wojciechowski | 414/223 |
| 4,808,291 | 2/1989 | Denton et al. | 414/225 |
| 4,869,801 | 9/1989 | Helms et al. | 414/225 |
| 4,898,507 | 2/1990 | Hawkswell | 414/225 |
| 4,907,701 | 3/1990 | Kobayashi et al. | 414/225 |
| 5,085,312 | 2/1992 | Ribordy et al. | 414/225 |
| 5,404,894 | 4/1995 | Shiraiwa | 414/416 |
| 5,405,230 | 4/1995 | Ono et al. | 414/416 |
| 5,407,314 | 4/1995 | Kempf | 414/223 |
| 5,549,444 | 8/1996 | Dubuit | 414/497 |
| 5,556,248 | 9/1996 | Grunes | 414/416 |
| 5,588,797 | 12/1996 | Smith | 414/416 |
| 5,609,463 | 3/1997 | Kobayashi et al. | 414/225 |
| 5,612,068 | 3/1997 | Kempf et al. | 414/223 |

FOREIGN PATENT DOCUMENTS

| | | | |
|---|---|---|---|
| 4230175 A1 | 3/1993 | Germany . | |
| 4418142 A1 | 12/1994 | Germany . | |
| 7-315565 | 12/1995 | Japan . | |
| 1315226 | 6/1987 | U.S.S.R. | 414/223 |
| 1337232 | 9/1987 | U.S.S.R. | 414/223 |
| 1344578 | 10/1987 | U.S.S.R. | 414/223 |

OTHER PUBLICATIONS

German Office Action dated Apr. 3, 1998 and English language translation of Official Letter dated Apr. 3, 1998 regarding German Patent Application No. 196 44 509.4–22.

Primary Examiner—David A. Bucci
Assistant Examiner—Douglas Hess
Attorney, Agent, or Firm—Staas & Halsey

[57] ABSTRACT

An IC handler affords ICs to be tested for a sufficiently long period of time for them to take up either heat or cold. A turntable is formed with N circular rows of positioning recesses lying on concentric circles. ICs to be tested are successively fed into the positioning recesses of either the outermost or innermost row. When each of the ICs makes a revolution with the rotation of the turntable, the IC is crossed over into one of the positioning recesses of another one of the rows. After the IC has made at least one revolution, it further travels through a predetermined angle from the cross-over position to a position of delivery to a testing section, and is then delivered to the testing section.

23 Claims, 7 Drawing Sheets

SEMICONDUCTOR DEVICE TRANSPORTING AND HANDLING APPARATUS

BACKGROUND OF THE INVENTION

1. Field of the Invention

The present invention relates to a semiconductor device transporting and handling apparatus (commonly called IC handler) which is suitable for use, in an IC testing apparatus (commonly called IC tester) for testing semiconductor devices such as semiconductor integrated circuit elements (hereinafter referred to as IC) typical of the semiconductor devices, for transporting ICs to a testing section, carrying the tested ICs out of the testing section and sorting them out. More particularly, the present invention relates to a semiconductor device transporting and handling apparatus which is capable of exposing semiconductor devices to an atmosphere of a predetermined temperature for a sufficiently long time prior to subjecting them to the testing.

2. Description of the Related Art

FIG. 6 illustrates the general construction of one example of the prior semiconductor device transporting and handling apparatus (hereinafter referred to as IC handler) called "horizontal transporting system". A plurality of tray groups denoted generally by the reference numeral 2 are disposed on a frame or platform 1 constituting a base along the lower side 1A thereof as viewed in the drawing. Each tray in the tray groups 2 is adapted to be loaded with ICs as the case may be. Each of the tray groups 2A–2E consists of a number of trays vertically stacked one on another. The leftmost tray group 2A as viewed in the drawing is positioned at a loader section. The trays of the group 2A in the loader section are loaded with ICs undergoing a test hereafter (ICs to be tested).

A carrier arm 3 picks up one IC at a time, in this example, from the uppermost tray of the stacked tray group 2A and transports it onto a turntable 4 called "soak stage". A row of positioning recesses 5 for defining the positions for receiving the ICs are formed in the turntable 4 at equal angular intervals on a concentric circle. Each positioning recess 5 is of substantially square shape and is surrounded on four sides by upwardly inclined walls. Each time the turntable 4 rotates by one pitch in a clockwise direction in the illustrated example, the carrier arm 3 drops one IC down into one of the positioning recesses 5.

The reference numeral 6 denotes a contact arm for transferring the ICs conveyed by the turntable 4 one by one to a testing section 7. Specifically, the contact arm 6 is adapted to pick up by vacuum suction an IC from each of the positioning recesses 5 in the turntable 4 and transports it to the testing section 7. The contact arm 6 has three arms and performs the operations, by rotation of the three arms, of sequentially transferring the ICs to the testing section 7 and of sequentially transferring the ICs tested in the testing section 7 to a transfer arm 8 located at an exit from the testing section. It should be noted that the turntable 4, the contact arm 6 and the testing section 7 are contained in a constant temperature chamber or thermostatic chamber 9 so that ICs to be tested may undergo the testing within the chamber 9 while being maintained at a predetermined temperature. The interior of the constant temperature chamber 9 is temperature controlled so as to be maintained at a preset high or low temperature to apply a predetermined temperature stress to ICs to be tested.

ICs taken out of the constant temperature chamber 9 by the transfer arm 8 located at the exit of the chamber are sorted out on the basis of the test results and stored in corresponding one of the three tray groups 2C, 2D and 2E in this example located in an unloader section. For example, non-conforming or bad ICs (ICs having a defect or failure) are stored in a tray of the rightmost tray group 2E, conforming or good ICs (ICs having no defect or failure) are stored in a tray of the tray group 2D at the left side of the tray group 2E, and ICs which have been determined to need a retest are stored in a tray of the tray group 2C at the left side of the tray group 2D. This sorting is performed by carrier arms 10 and 11.

The tray group 2B located at the second position from the leftmost side is an empty tray group located at a buffer section for accommodating trays emptied of ICs in the loader section. When the uppermost tray of any one of the tray stacks of the tray groups 2C, 2D and 2E in the unloader section is filled with ICs, a tray of this empty tray group 2B is conveyed to the top of the corresponding tray stack to be used to store ICs therein.

While in the IC handler illustrated in FIG. 6 the turntable 4 has only one row of positioning recesses 5 spaced at equal angular intervals for defining the positions for receiving the ICs formed therein on a concentric circle such that each time the turntable 4 rotates by one pitch in a clockwise direction the carrier arm 3 deposits one IC into one of the positioning recesses 5, another type of IC handler as shown in FIG. 7 is also in practical use in which the turntable 4 has two rows of angularly equally spaced apart positioning recesses 5 formed therein on concentric circles. The arrangement in the latter case is such that the carrier arm 3 transports two ICs to be tested at a time from a tray located in the loader section and deposits the two ICs into corresponding two of the positioning recesses 5 of the two rows with each incremental (one pitch) rotation of the turntable 4. The IC handler shown in FIG. 7 is identical to that shown in FIG. 6 except that the contact arm 6, the transfer arm 8 at the exit side and the carrier arm 10 are adapted to handle two ICs at a time and that the testing section 7 is also configured to conduct examination on two ICs at a time. Accordingly, the corresponding parts of the FIG. 7 configuration are indicated by the same reference numerals and will not be further described.

It should be pointed out here that in the IC handler shown in FIG. 6, an IC to be tested is deposited on the turntable 4 at an angular position (A) by the carrier arm 3 and delivered from the turntable 4 at an angular position (B) to the testing section 7 by the contact arm 6. While being carried by the turntable 4 through about 240° from the position (A) to the position (B), the IC is heated (or cooled) to the temperature in the constant temperature chamber 9.

Typically, since positioning recesses 5 are formed in the turntable 4 with a pitch (angular interval) of about 12° on a concentric circle, there are twenty positioning recesses 5 arrayed within the angular extent of 240°. It is to be noted that the time required for the IC to undergo the test in the testing section 7 is comparatively short, say, of the order of a few seconds. If the turntable 4 is rotated in synchronism with the testing period in the testing section 7, relatively large size ICs may not reach the designed temperature in the constant temperature chamber 9 within the time during which they are moved from the angular positions (A) to (B), due to the short distance of travel between the two positions (A) and (B). For this reason, despite the fact that the test in the testing section 7 has been completed, there may have to be a waiting time until the ICs to be tested next are heated (or cooled) to a predetermined temperature, resulting in an undesirable increase in the time required for the testing.

Likewise, with the IC handler shown in FIG. 7, an IC to be tested is deposited on the turntable 4 at an angular position (A) and delivered from the turntable 4 at an angular position (B) to the testing section 7, during which the IC is carried by the turntable 4 through about 240°. Since two rows of positioning recesses 5 lying on concentric circles in the turntable 4 are also arranged with a pitch of about 12°, there are twenty positioning recesses 5 within the angular extent 240°. Consequently, as is the case with the IC handler shown in FIG. 6, relatively large size ICs may not reach the designed temperature within the time during which they are moved from the angular positions (A) to (B), because of the distance of travel between the two positions (A) and (B) being too short, so that notwithstanding the test in the testing section 7 having been completed, a wait may be required until the ICs to be tested next are heated (or cooled) to a predetermined temperature, resulting in an undesirably elongated time required for the testing.

SUMMARY OF THE INVENTION

It is an object of the present invention to provide a semiconductor device transporting and handling apparatus which is capable of exposing semiconductor devices to be tested to an atmosphere of a predetermined temperature for a sufficiently long time, so that the testing operation on semiconductor devices may be repeated in the testing period in the testing section by rotating the turntable in synchronism with the testing period in the testing section.

According to a first aspect of the present invention, a semiconductor device transporting and handling apparatus is provided which includes a turntable having N (N is an integral number equal to or greater than 2) rows of positioning recesses formed therein on concentric circles, and which is arranged such that the loading of semiconductor devices to be tested onto the turntable is started with either the outermost or the innermost at least one row of positioning recesses, and when each of the loaded semiconductor devices to be tested makes a round to return to the original position of loading, it is crossed over (transferred) at that position to another row of positioning recesses, and after each of the loaded semiconductor devices to be tested has made at least one round, each of the loaded semiconductor devices to be tested is further moved through a predetermined angle from the cross-over position to a position of delivery to a testing section at which position it is delivered to the testing section. It is thus to be appreciated that each of the semiconductor devices makes at least one revolution plus a predetermined angle rotation from the cross-over position to the delivery position prior to being delivered to the testing section.

With the construction described above of the semiconductor device transporting and handling apparatus, a semiconductor device to be tested is carried on the turntable while being rotated by at least one revolution plus a predetermined angle rotation from the cross-over position to the delivery position, and then delivered to the testing section. Accordingly, the time required for at least one revolution plus the time required for the revolution through the predetermined angle up to the position of delivery to the testing section is available to apply temperature stress of a predetermined temperature to semiconductor devices to be tested. Since this added time for at least one revolution is longer than the time for the rotation through the predetermined angle up to the position of delivery to the testing section, more than twice as much time as with the prior apparatus can be utilized to raise or lower the temperature of semiconductor devices to be tested to a predetermined level. It is thus possible to provide devices to be tested with a sufficient period of time for them to be properly heated or cooled, so that there would occur no problem if the turntable is rotated in synchronism with the testing period in the testing section whereby the time required to test semiconductor devices may be reduced.

According to a second aspect of the present invention, a semiconductor device transporting and handling apparatus is provided which comprises a turntable having a circular array of positioning recesses formed therein, each positioning recess having a sufficient depth to accommodate a plurality of semiconductor devices to be tested in a vertical stack, an elevator disposed in the bottom of each positioning recess for vertically moving the semiconductor devices stacked one on another, and drive means disposed at a loading position where the semiconductor devices to be tested are loaded into the positioning recesses on the turntable and at a position of delivery where the semiconductor devices to be tested are delivered from the positioning recesses on the turntable to the testing section, the drive means being adapted to drive the elevator so as to be able to stop the latter at positions corresponding in number to the semiconductor devices stacked one on another and such that at the loading position each elevator is raised by the drive means to a predetermined position so as to maintain constant the distance of downward travel that the semiconductor devices drop into the recesses, and that at the position of delivery each elevator is moved by the drive means so as to permit a vacuum pick-up means to pick up the semiconductor devices always at the level of the uppermost one of the stacked semiconductor devices in each of the positioning recesses.

With the construction described just above of the semiconductor device transporting and handling apparatus, semiconductor devices are carried by the turntable with a plurality of semiconductor devices placed in each of the positioning recesses, so that the turntable is kept standing still at the position of delivery until all of the semiconductor devices placed in one of the positioning recesses are transferred to and tested in the testing section. This makes it possible to reduce the rotational speed of the turntable by the number of semiconductor devices which can be accommodated in one positioning recess. As a result, it becomes possible to increase the period between the time when semiconductor devices to be tested are loaded on the turntable and the time when they are unloaded in the vicinity of the testing section. Accordingly, a sufficiently long period of time is available to apply a temperature stress to semiconductor devices to be tested so that the temperature of the semiconductor devices may adequately approach the designed temperature.

DETAILED DESCRIPTION OF THE PREFERRED EMBODIMENTS

Now preferred embodiments of the present invention will be described in details with reference to the accompanying drawings. While the embodiments of the present invention are described with reference to ICs typical of semiconductor devices, it is to be understood that the present invention is also applicable to the apparatus for transporting and handling semiconductor devices other than ICs.

Figure 1:
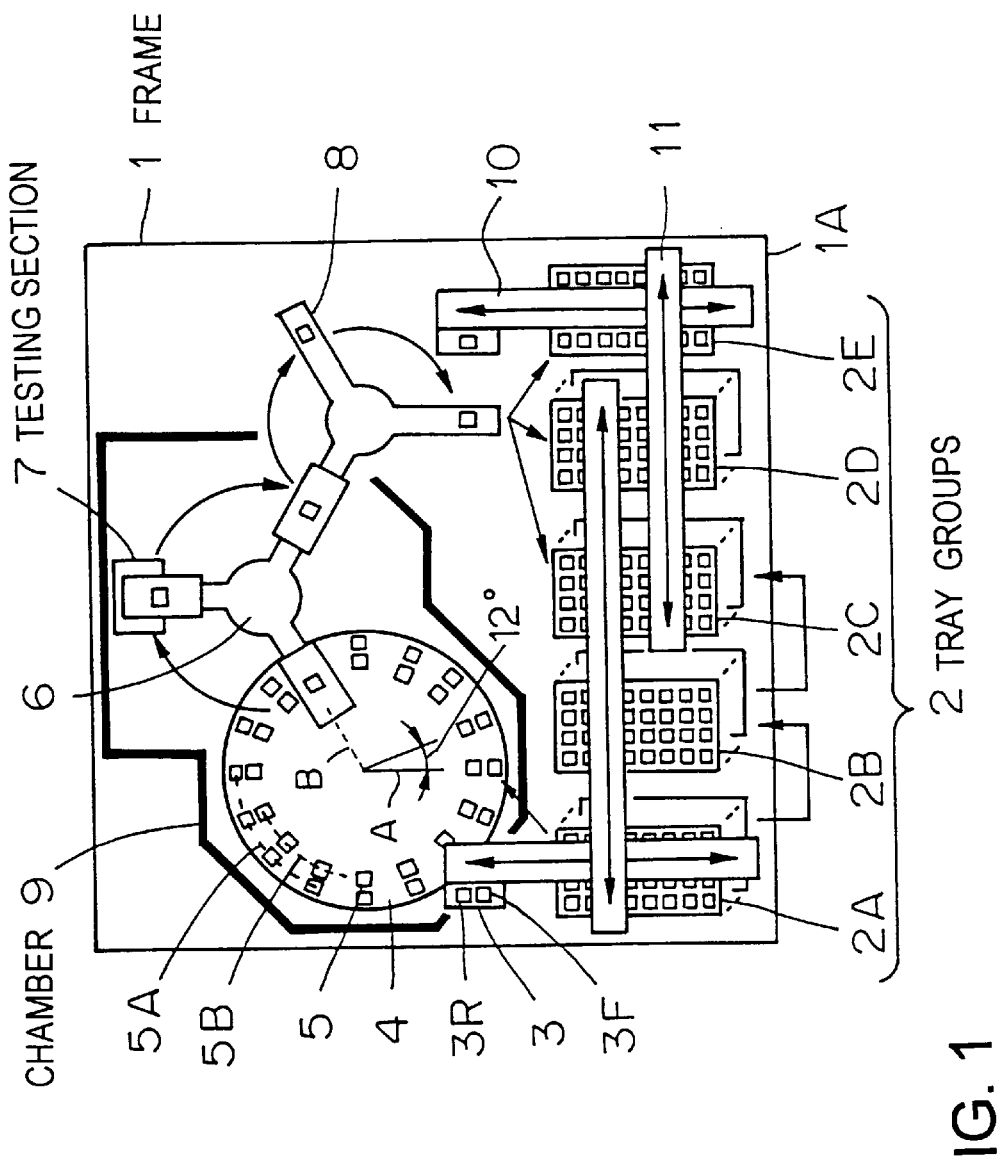
FIG. 1 is a plan view illustrating the general arrangement of a first embodiment of the IC handler according to the present invention.

FIG. 1 illustrates the general construction of the first embodiment of the IC handler according to the present invention. While in this embodiment two rows of positioning recesses 5 spaced at equal angular intervals are shown as formed on concentric circles in the turntable 4, it is to be understood that there may be more than two circular arrays of positioning recesses 5. Where there are two circular arrays of positioning recesses 5 arranged on concentric circles, the carrier arm 3 is provided with two pick-up heads in correspondence with the number of the circular arrays of positioning recesses. Specifically, it is seen in this embodiment that the carrier arm 3 is provided with two pick-up heads 3R and 3F one adjacent each of its distal and proximal ends for picking up and carrying an IC to be tested by means of vacuum suction, for example.

The pick-up head 3F disposed adjacent the proximal end picks up ICs to be tested one by one from the uppermost tray of the tray group 2A in the loader section, and carries it to the angular position (A) which is the IC loading position on the turntable 4 where the pick-up head releases the IC held by vacuum to allow it to drop into one of the positioning recesses 5 of the outer array 5A of the two rows of positioning recesses arranged on concentric circles. It will be appreciated that when the pick-up head 3F picks up an IC from the uppermost tray of the tray group 2A, the carrier arm 3 held at a standstill moves the pick-up head 3F downwardly to move its suction face closer to the IC to pick it up. Likewise, when the pick-up head 3F drops the vacuum attracted IC into the positioning recess 5 at the IC loading position (A), the carrier arm 3 at a standstill moves the pick-up head 3F downwardly closer to the bottom of the positioning recess 5 prior to dumping the IC. The operation of the other pick-up head 3R is similar to that of the pick-up head 3F.

Once the turntable 4 has made a round to load all of the positioning recesses 5 of the outer array 5A with ICs to be tested (that is, all of the recesses of the outer array has been full), the pick-up head 3F still continues to pick up an IC to be tested from the tray group 2A and is moved together with the other empty pick-up head 3R to the IC loading position (A), but this time the empty pick-up head 3R is first actuated to pick up the IC having made a round from the positioning recess 5 of the outer array 5A, followed by shifting the pick-up head 3R now having the IC attracted thereto to above one of the positioning recesses 5 of the inner array 5B while at the same time the pick-up head 3F having the IC to be tested picked up from the tray group 2A is moved to above the now emptied positioning recess 5 of the outer array 5A.

Figure 2:
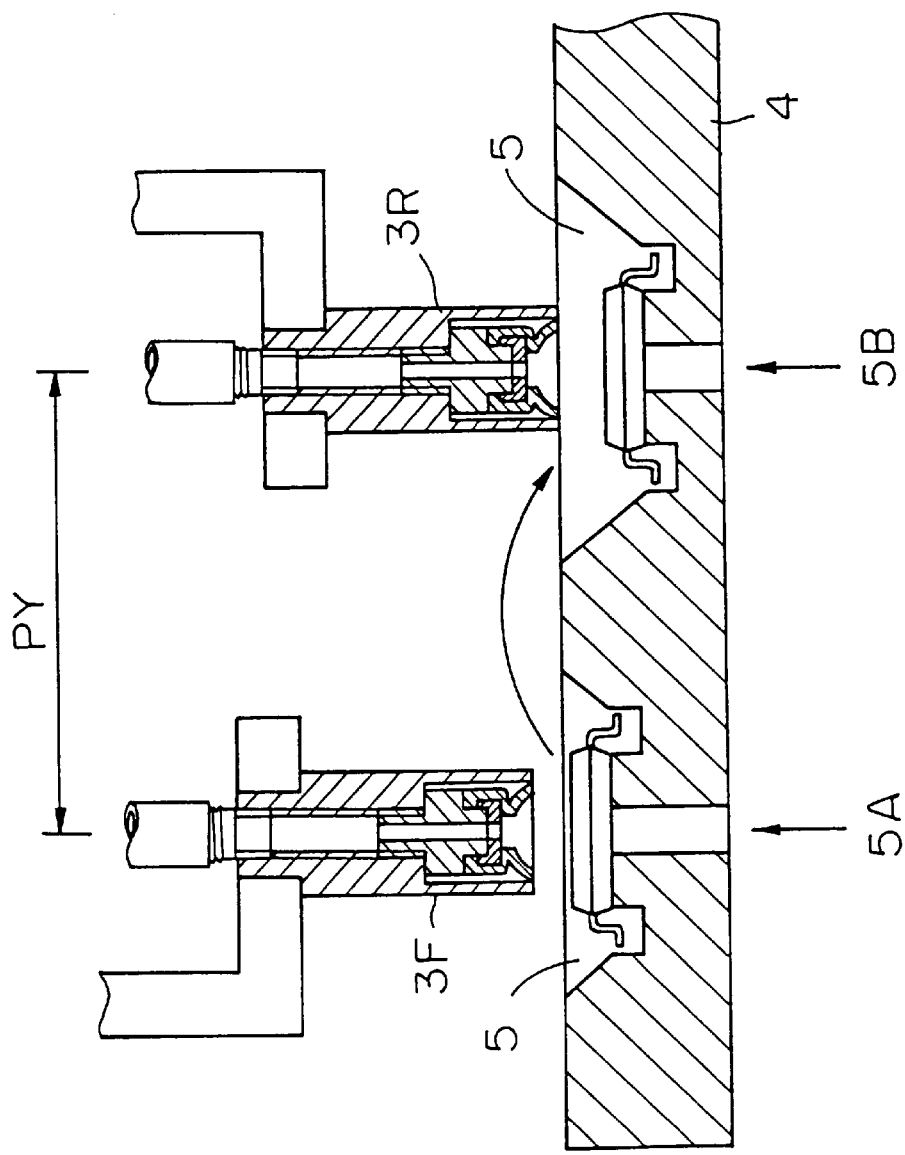
FIG. 2 is an enlarged cross-sectional view illustrating the construction of the principal parts of the first embodiment.

As shown in FIG. 2, the pick-up heads 3R and 3F are mounted on the carrier arm 3 at the spacing equal to the radial spacing PY between the concentric arrays 5A and 5B of recesses such that the distal pick-up head 3R and the proximal pick-up head 3F overlie the positioning recesses 5 of the inner array 5B and the outer array 5A, respectively, so as to be able to drop ICs into the associated positioning recesses 5. It should be understood, however, that the spacing between the pick-up heads 3R and 3F need not necessarily be equal to the radial spacing PY between the concentric arrays 5A and 5B of recesses. If the spacing between the pick-up heads 3R and 3F is larger than spacing PY, the arrangement may be such that the empty pick-up head 3R is actuated to pick up the IC having made a round from the positioning recess 5 of the outer array 5A, followed by shifting the pick-up head 3F having a new IC attracted thereto to above one of the positioning recesses 5 of the outer array 5A to drop it thereinto, and then moving the pick-up head 3R carrying the IC picked up from the positioning recess 5 of the outer array 5A to above one of the positioning recesses 5 of the inner array 5B to drop it thereinto.

Once the ICs to be tested have been deposited into the respective positioning recesses 5, the carrier arm 3 is moved back to above the uppermost tray of the tray group 2A to allow the pick-up head 3F to pick up one IC from the tray group 2A, and then the carrier arm 3 moves the empty pick-up head 3R to above one of the positioning recesses 5 of the outer array 5A in the turntable 4. In the meantime, the turntable 4 has rotated by one pitch, so that when the empty pick-up head 3R has returned to above the positioning recess 5 at the IC loading position (A) of the outer array 5A, the next IC to be tested having made a round as carried on the turntable 4 has arrived at a position below this empty pick-up head 3R.

Then, the empty pick-up head 3R picks up this next IC to be tested and is advanced by the spacing PY in unison with the pick-up head 3F carrying the IC picked up from the tray group 2A, whereupon the pick-up heads 3R and 3F release the ICs held thereby to allow them to drop into the positioning recesses 5 of the inner and outer arrays 5B and 5A, respectively (as shown in FIG. 2). By repeating this operation, the ICs to be tested may be crossed over successively from the recesses of the outer array 5A into those of the inner array 5B.

When the first of the ICs to be tested which have been crossed over to the recesses of the inner array 5B arrives at the angular position (B) for delivering the IC to the testing section 7, the contact arm 6 picks up the IC to be tested from the recess of the inner array 5B and transports the vacuum attracted IC to the testing section 7. ICs having undergone the testing in the testing section 7 are transferred one by one to the transfer arm 8 which in turn delivers the ICs to the carrier arm 10. The tested ICs are then sorted out on the basis of the test results and stored in the corresponding tray groups 2C, 2D and 2E in the unloader section by means of the carrier arms 10 and 11.

As noted in FIG. 2, the positioning recesses 5 of the inner circular array 5B formed in the turntable 4 are made deeper than the positioning recesses 5 of the outer circular array 5A. The pick-up head 3F having attracted thereto an IC to be tested from the tray group 2A is stopped at a position the level of which is higher than by a predetermined distance the top surface of the turntable 4 to allow the attracted IC to drop into one of the positioning recesses 5 of the outer array 5A as shown in FIG. 2. This is partly because it is required for an IC to be allowed to drop a certain distance by its own weight to insure precise positioning in the recess, and partly because if the pick-up head 3F were too close to the positioning recess 5, the lead pins (terminals) of the IC might possibly come into touch with the tapered walls of the recess 5 to thereby be distorted or otherwise damaged. On the other hand, from the standpoint of operational efficiency, it is preferable to make the vertical distances of travel of the pick-up heads 3F, 3R as short as possible and to make the travel distances of the pick-up heads equal at all times to simplify the controlling. For this reason, in the illustrated embodiment, the vertical travel distance of the pick-up head 3F for dropping the IC into the recess 5 is set to be made equal to that for picking up the IC from the tray group 2A.

In contrast, the other pick-up head 3R, as described above, performs the operation of picking up an IC to be tested having made a round from the positioning recess 5 of the outer array 5A and then dumping the attracted IC into the positioning recess 5 of the inner array 5B. When picking up an IC from the positioning recess 5 of the outer array 5A, the pick-up head 3R picks it up with its lower end (suction end) lowered to near the top surface of the IC. It can be appreciated from FIG. 2 that the pick-up head 3R is lowered substantially to the level of the top surface of the turntable 4 to vacuum attract the IC. Thus, the pick-up head 3R is depressed to a position lower than the position where the pick-up head 3F dumps the IC into the positioning recess 5 of the outer array 5A. In this regard, because it is preferable and advantageous that the vertical travel distance of the pick-up head 3R be as short as possible and be equal to that of the pick-up head 3F, it is to be noted in the illustrated embodiment that the pick-up head 3R is affixed to the carrier arm 3 such that it is lower than the pick-up head 3F by a distance corresponding to the difference in level (elevation) between the lowered positions of the two heads so that the pick-up head 3R may pick up an IC from the recess 5 of the outer array 5A with the same short vertical travel distance as that of the pick-up head 3F. The vertical travel distance of the pick-up head 3R is set to be equal to the pick-up head 3F.

Since the pick-up head 3R is set to have the same short vertical travel distance as that of the pick-up head 3F as discussed above, it will be appreciated from FIG. 2 that making the depth of the positioning recesses 5 of the inner array 5B equal to that of the positioning recesses 5 of the outer array 5A would greatly reduce the distance that the IC picked up from the recess 5 of the outer array 5A by the pick-up head 3R is moved down when it is dropped into the recess 5 of the inner array 5B. Consequently, not only it would be difficult to precisely position the IC in the recess, but also the lead pins (terminals) of the IC could come into touch with the tapered walls of the recess 5 to thereby be distorted or otherwise damaged. In view of this, the positioning recesses 5 of the inner array 5B are formed deeper than the positioning recesses 5 of the outer array 5A so that when the IC is released from the pick-up head 3R which is adapted to descend to a position lower than the pick-up head 3F does, the IC is allowed to drop by its own weight the same distance that an IC moves down when it drops into the recess 5 of the outer array 5A. Thus, in this example, the positioning recesses 5 of the inner array 5B are formed deeper than the positioning recesses 5 of the outer array 5A by the difference in level between the positions at which the two pick-up heads 3F and 3R are mounted.

In addition, the turntable 4 is a much greater mass or source of heat or cold maintained at the temperature in the constant temperature chamber 9 as compared with an IC to be tested, so that the heat or cold of the turntable 4 is more efficiently conducted to the ICs held in the deeper positioning recesses 5 of the inner array 5B. It is thus to be understood that storing IC to be tested deeper in the positioning recesses 5 of the turntable 4 provides the additional advantage of further insuring that ICs to be tested be either heated or cooled to a predetermined temperature.

While the embodiment described above is configured such that ICs to be tested from the loader section are loaded first onto the outer row 5A of positioning recesses, and when each of the loaded ICs to be tested makes one revolution, it is crossed over from the outer row 5A of positioning recesses to the inner row 5B of positioning recesses to be delivered to the testing section, ICs to be tested from the loader section are loaded first onto the inner row 5B of positioning recesses, and when each of the loaded ICs to be tested makes one revolution, it is crossed over from the inner row 5B of positioning recesses to the outer row 5A of positioning recesses to be delivered to the testing section.

Further, while in the embodiment described above two circular rows of positioning recesses are shown as arranged on concentric circles, there may be N (N is an integral number equal to or greater than 2) circular rows of positioning recesses. For example, three circular rows of positioning recesses may be formed on concentric circles on the turntable 4 and ICs to be tested from the loader section may be loaded first onto the outermost or innermost row of positioning recesses, and when each of the loaded ICs on the outermost or innermost row makes one revolution, it is crossed over from the outermost or innermost row to the middle row of positioning recesses, and when each of the loaded ICs on the middle row makes further one revolution, it is crossed over from the middle row to the innermost or outermost row to be delivered to the testing section. In other words, ICs to be tested loaded onto each of the positioning recesses of the outermost or innermost row at the angular position (A) may be rotated by two revolutions (N−1 revolutions), and then ICs to be tested may be further rotated from the angular position (A) to the angular position (B) to be delivered to the testing section.

Figure 7:
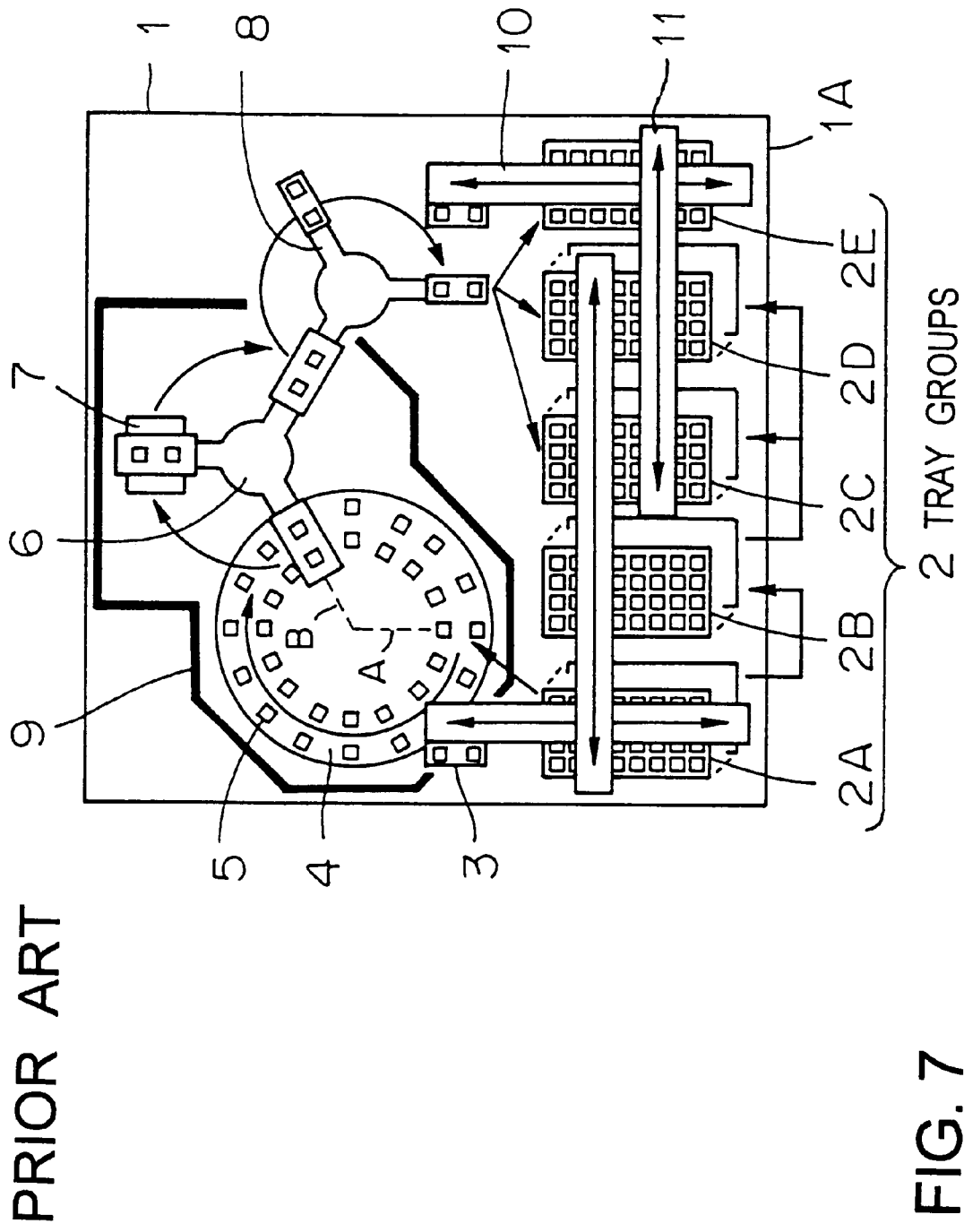
FIG. 7 is a plan view illustrating the general arrangement of another example of the prior IC handler of the horizontal transporting type.

Also, in the case of the IC handler configured to transport two ICs at a time as illustrated in FIG. 7, four circular rows of positioning recesses may be formed on concentric circles and the carrier arm 3 provided with four pick-up heads. The arrangement may be such that the carrier arm 3 loads two ICs at a time from the tray group 2A in the loader section onto the two outermost rows of positioning recesses, for example, and when the loaded ICs to be tested makes one revolution, they are crossed over from the two outermost rows of positioning recesses to the remaining two innermost rows of positioning recesses, while at the same time two ICs to be tested are loaded from the tray group 2A in the loader section onto the now emptied two outermost rows of positioning recesses, and two ICs to be tested are delivered from the two innermost rows of positioning recesses to the testing section.

That is, in case the carrier arm 3 loads two or more ICs at a time from the tray group 2A in the loader section onto the two or more outermost (innermost) rows of positioning recesses, the carrier arm 3 may be provided with the number of pick-up heads corresponding to the number of ICs which may be loaded onto the outermost (innermost) rows at a time from the tray group 2A in the loader section.

According to the first embodiment, an IC to be tested is placed into each of the positioning recesses 5 in the turntable 4 at the angular position (A) that is the IC loading position and is then rotated by at least one revolution, followed by being moved through a predetermined angle (240°) to the angular position (B) that is the delivery position to the testing section to be delivered to the testing section 7.

Accordingly, during the time required for at least one revolution plus the time required for the revolution through the predetermined angle to the delivery position to the testing section 7, an IC to be tested is exposed to the temperature in the constant temperature chamber 9 to be afforded a predetermined temperature stress. Since this added time for at least one revolution is longer than the time for the revolution through the predetermined angle to the position of delivery to the testing section 7, more than twice as much time as with the conventional IC handler can be utilized to raise or lower the temperature of ICs to be tested to a predetermined level. It is thus possible to provide ICs to be tested with a sufficient period of time for them to be properly heated or cooled, so that there would be no problem involved if the turntable 4 is rotated in synchronism with the testing period in the testing section 7 whereby the time required to test ICs may be reduced.

Figure 4:
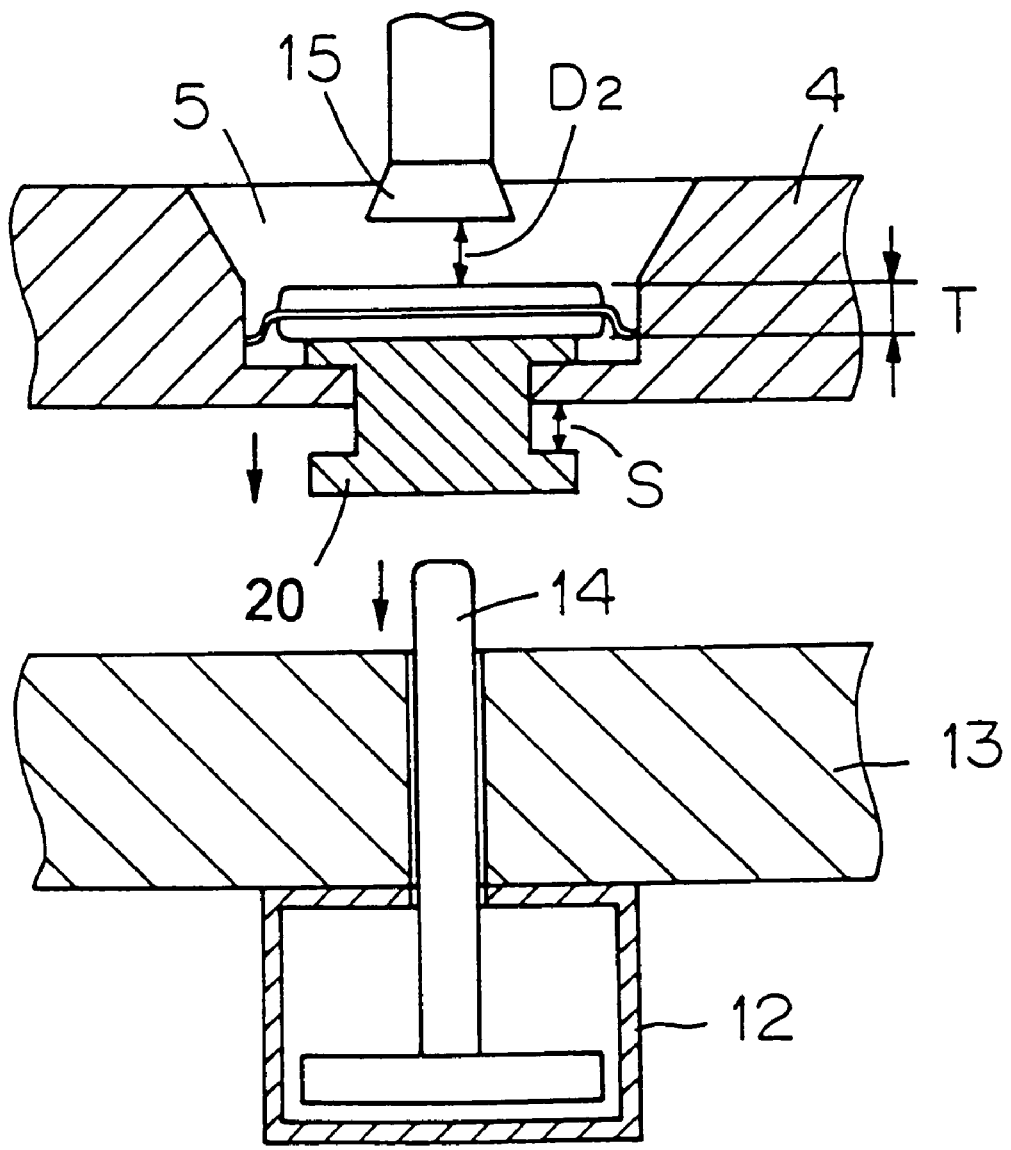
FIG. 4 is an enlarged cross-sectional view illustrating the construction of the principal parts of the second embodiment of the IC handler according to the present invention.
Figure 5:
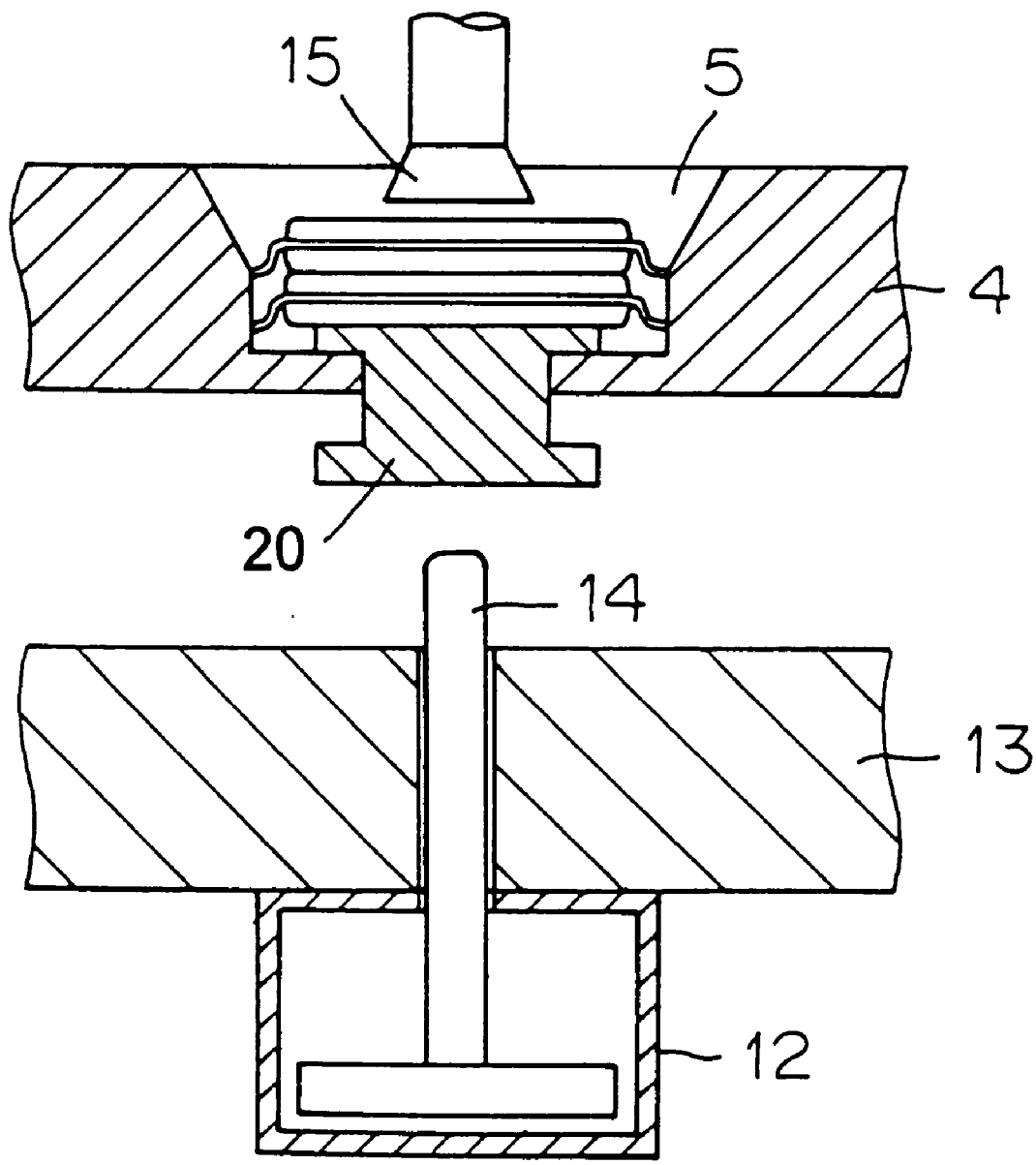
FIG. 5 is an enlarged cross-sectional view illustrating the construction of the principal parts of the second embodiment of the IC handler according to the present invention.

The second embodiment of the IC handler according to the present invention will now be described with reference to FIGS. 3 to 5. Since in the second embodiment the present invention is applied to the IC handler of the construction shown in FIG. 7, the components corresponding to those of the handler shown in FIG. 7 are denoted by the like reference numerals and will not be further described unless required.

Figure 3:
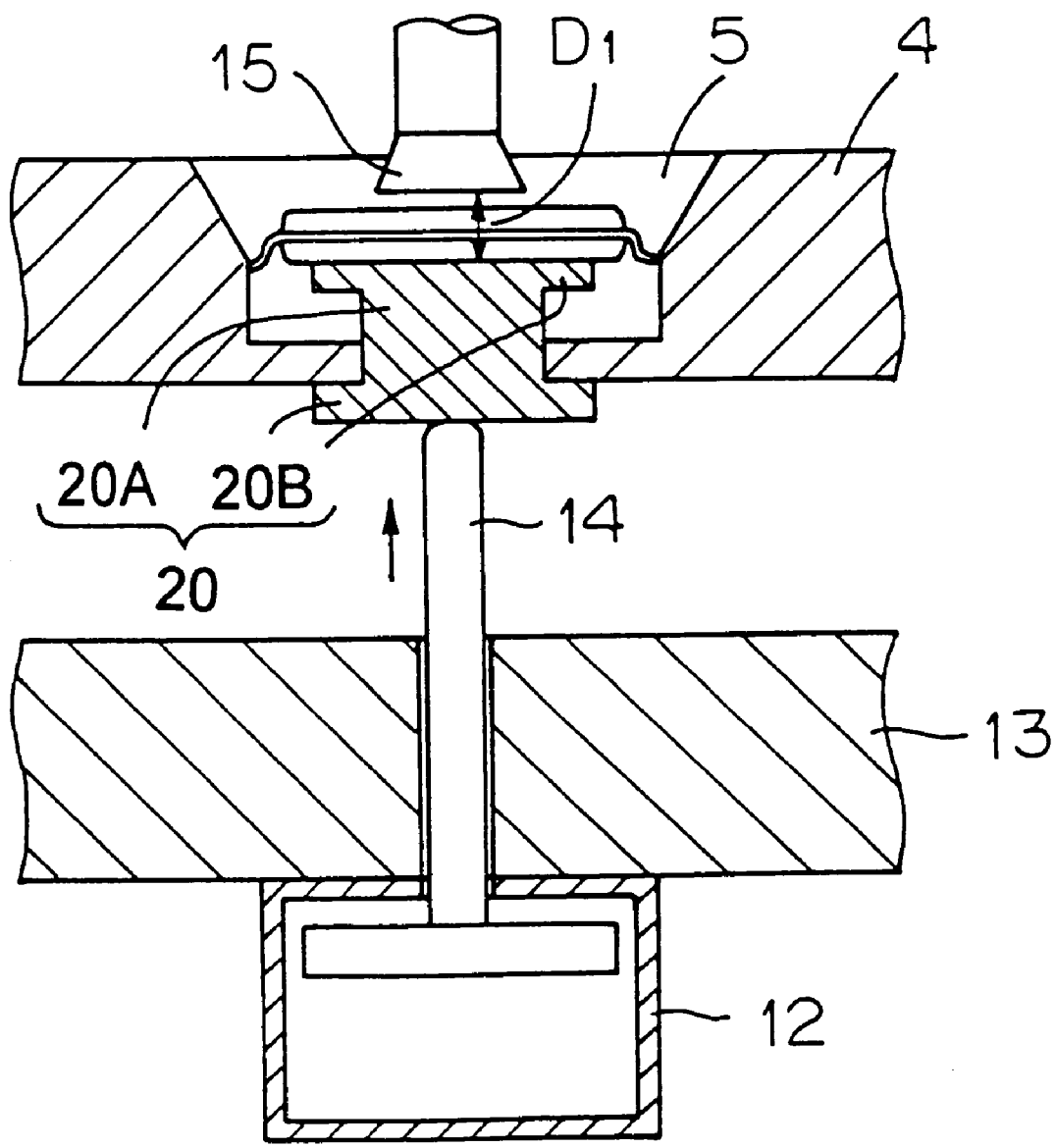
FIG. 3 is an enlarged cross-sectional view illustrating the construction of the principal parts of a second embodiment of the IC handler according to the present invention.

FIG. 3 is an enlarged cross-sectional view illustrating one of the positioning recesses 5 formed in the turntable 4 which is the principal part of the second embodiment. As is noted from FIG. 7, the turntable 4 is formed with two rows of angularly equally spaced positioning recesses 5 annularly disposed on concentric circles. However, since the positioning recesses 5 formed in the turntable 4 are all identical in configuration, structure and construction, representatively shown in FIG. 3 is the positioning recess 5 which has been rotated to the angular position (A), that is, the IC loading position, ready for receiving an IC carried from the tray group 2A in the loader section.

In this second embodiment, positioning recesses 5 having a depth greater than that of the conventional positioning recess are formed at equal angular intervals in the turntable 4. An elevator 20 is disposed in the bottom of each of the positioning recesses 5. In this embodiment, since each of the positioning recesses 5 is configured to accommodate two ICs to be tested, each positioning recess has a depth sufficient to accommodate two ICs. The elevator 20 is mounted in the bottom of the positioning recess 5 for vertically upward and downward movements and is adapted to receive an IC to be tested on its upper surface.

Specifically in this embodiment, the elevator 20 comprises a cylindrical body 20A having flanges 20B extending therefrom at its opposite ends, the cylindrical body 20A being slidably received in an opening formed through the bottom wall of the positioning recess 5. The upper and lower flanges 20B serve as stops to limit the vertical travel distance of the elevator 20 by abutting against the bottom wall of the positioning recess 5.

At the angular positions (A) and (B) (see FIG. 7) there are disposed drive means 12 for raising and lowering the elevators 20. In this embodiment, since two rows of positioning recesses 5 are formed on concentric circles in the turntable 4, two drive means 12 are provided at each of the angular positions (A) and (B). While in this embodiment each drive means 12 comprises an air cylinder-piston assembly, it is to be understood that other drive means may be employed.

The drive means 12 are mounted to the exterior of the constant temperature chamber 9. By way of example, as shown, the cylinder portion of each drive means 12 is mounted to the outer surface of the insulation wall (bottom wall) 13 of the constant temperature chamber 9 with the movable rod (piston rod) 14 of each drive means 12 extending upwardly through of the insulation wall 13 close to the undersurface of the turntable 4. In this configuration since each elevator 20 is normally in its lower position by virtue of its own weight, each drive means 12 is preferably positioned such that when the piston rod 14 of the drive means 12 is in its retracted position, the top end of the piston rod 14 is positioned slightly below the bottom end face of the elevator 20 lowered in its lower position.

When the positioning recesses 5 and hence the associated elevators 20 are moved by rotation of the turntable 4 to either of the angular positions (A) and (B) where the drive means 12 are disposed, the top end of the piston rod 14 of each of the two drive means 12 is in a position close to the bottom end face of the elevator 20. From this position each drive means 12 is actuated to extend the piston rod 14 upwardly to thereby raise the elevator 20 to the upper position shown in FIG. 3. When each drive means 12 is reversely actuated to retract the piston rod 14 downwardly, the elevator 20 is allowed to descend from the upper position to the lower position shown in FIGS. 4 and 5 by its own weight.

As indicated above, each elevator 20 is adapted to assume two vertical levels of positions, the upper and lower positions. Each elevator 20 located at the angular position (A) of the turntable 4 is first raised to and supported at the upper position by the associated drive means 12 where the elevator receives a first IC to be tested from the pick-up head 15 of the carrier arm 3. Upon the elevator receiving the first IC, the drive means 12 is reversely actuated to retract the piston rod 14 downwardly, whereby the elevator 20 is allowed to descend to and be stopped at the lower position as shown in FIG. 4 where the elevator receives a second IC to be tested from the pick-up head 15 of the carrier arm 3 on the previously received first IC (see FIG. 5). At this point it is to be appreciated that the distance D1 of downward travel of the first IC can be made equal to the distance D2 of downward travel of the second IC by designing the vertical stroke S of travel of the elevator 20 so as to be equal to the thickness T of one IC as shown in FIG. 4. It is thus possible to drop any IC to be tested into all of the positioning recesses 5 under the same conditions (through the same distance of downward travel).

It will be appreciated that each of the pick-up heads 15 affixed to the carrier arm 3 is adapted to be moved downwardly from the carrier arm 3 to attract and hold an IC by the action of vacuum suction as with the prior art illustrated in FIG. 7. While FIGS. 3 to 5 show only one pick-up head 15, two pick-up heads are actually attached to the carrier arm 3 so that two ICs may be handled simultaneously. As illustrated in FIG. 5, at the IC loading angular position (A) of the turntable 4 two ICs to be tested are deposited into each of the positioning recesses 5 of the two annularly disposed rows, and are moved from the angular position (A) to the angular position (B) of the turntable 4 for delivering the ICs to the testing section 7. During the movement from the angular position (A) to the angular position (B), the ICs are exposed to the temperature in the constant temperature chamber 9.

At the angular position (B), two pick-up heads affixed to the contact arm 6 pick up ICs to be tested from the positioning recesses 5 of the outer and inner rows, respectively, and transport them to the testing section 7. More specifically, as two ICs to be tested are stored in the form of a vertical stack in each of the positioning recesses 5, the two pick-up heads of the contact arm 6 first pick up the upper ICs of the stacks from the two positioning recesses 5 of the outer and inner rows, respectively, and transport them to the testing section 7. The two drive means 12 are then actuated to raise the elevators 20 to the upper position shown in FIG. 3. In this position, the two pick-up heads of the contact arm 6 this time pick up the now exposed and raised lower ICs of the stacks from the two positioning recesses 5 of the outer and inner rows, respectively, and transport them to the testing section 7. Upon two ICs to be tested stored in each of the positioning recesses 5 of the outer and inner rows being thus transported to the testing section 7, the two drive means 12 are reversely actuated to allow the elevators 20 to descend to the lower position shown in FIGS. 4 and 5. During this process, the turntable 4 is kept standing still.

It can thus be appreciated that since the turntable 4 is kept standing still during the time required for testing in the testing section 7 two ICs stacked one on another in one positioning recess, the time interval required to move the turntable 4 by one pitch will be twice as much as the testing period (the time required for testing one IC) in the testing section 7. In other words, the rotational speed of the turntable 4 can be reduced. This permits the ICs to be tested carried by the turntable 4 to be exposed sufficiently to the temperature in the constant temperature chamber 9 to insure that temperature stress of a predetermined temperature is applied to the ICs. On the other hand, it should be noted that the testing period in the testing section 7 is the same as with the prior art IC handler as illustrated in FIG. 7. Consequently, there is no reduction involved in the number of ICs to be tested per unit time, nor is there any increase in the testing time.

When the two elevators 20 are in their upper positions, the exposed lower IC of the vertical stack in the associated one of the positioning recesses 5 is positioned at the same level as that previously assumed by the upper one of the two vertically stacked ICs. This permits the two pick-up heads of the contact arm 6 to pick up the lower ICs by the same stroke as when picking up the upper ICs and transport them to the testing section 7. It can be appreciated that the operation of controlling the vertical movements of the pick-up heads may thus be facilitated and that the accurate picking-up operation of the pick-up heads is insured.

While the second embodiment is illustrated as each of the positioning recesses 5 formed in the turntable having a depth sufficient to accommodate two ICs, it is to be understood that each positioning recess may be configured to accommodate more than two ICs. If the number of ICs to be accommodated in each of the positioning recesses 5 is N (N is an integral number equal to or greater than 2), the drive means 12 for raising and lowering the associated elevator 20 may only need to be configured to have N stop positions. By way of example, such drive means may comprise a stepping motor and a linearly movable means such as a pinion and rack assembly driven by the stepping motor, or a linearly movable means utilizing a screwing mechanism.

Figure 6:
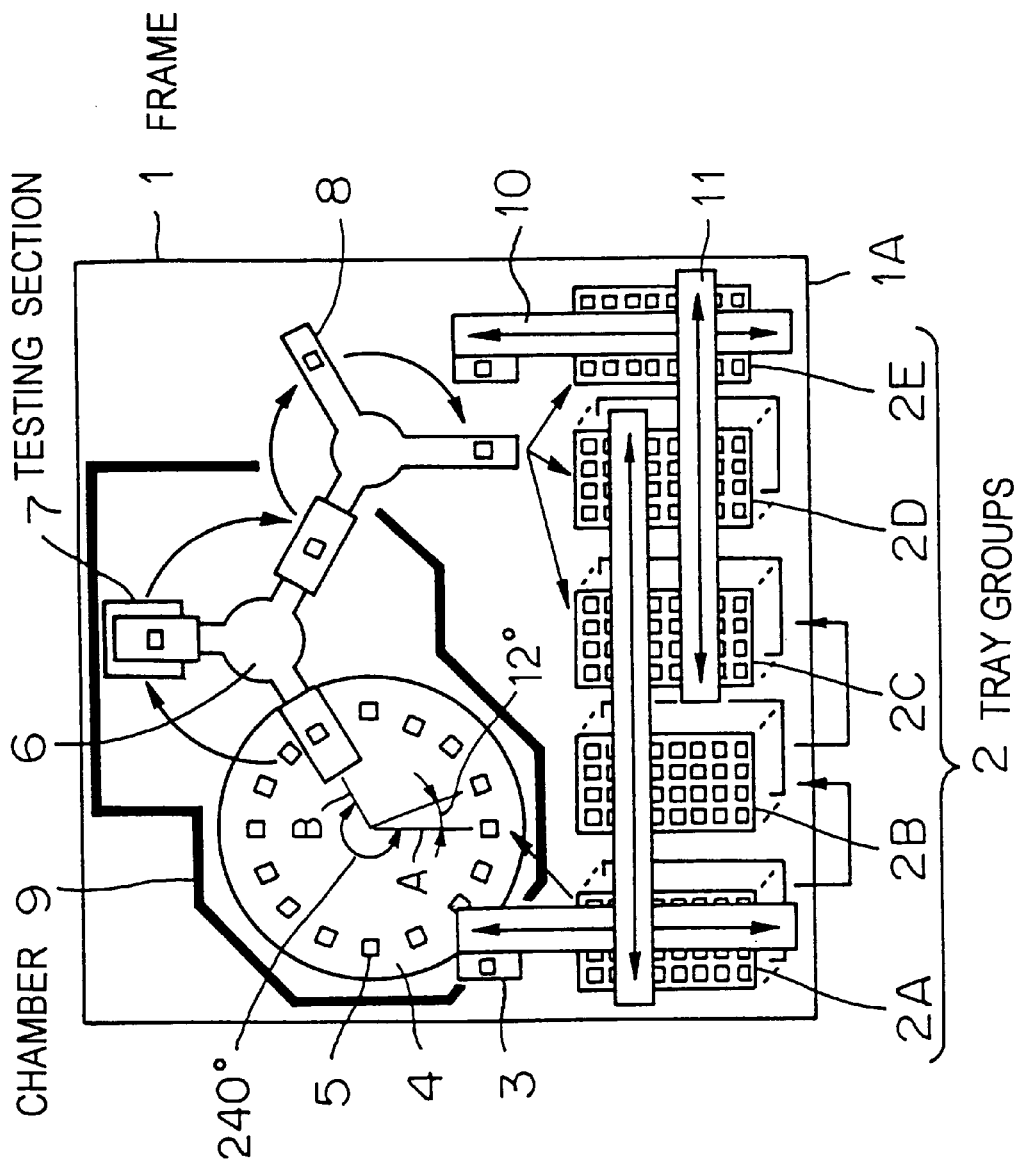
FIG. 6 is a plan view illustrating the general arrangement of an example of the prior IC handler of the horizontal transporting type.

In addition, it will be appreciated that the present invention may be applicable not only to the IC handler equipped with the turntable 4 having two circular rows of positioning recesses formed on concentric circles, but also to the IC handler as shown in FIG. 6 equipped with the turntable having only one circular row of positioning recesses as well as to an IC handler including a turntable having more than two circular rows of positioning recesses, with the resultant equal functional advantages.

As discussed hereinabove, according to the first aspect of the present invention, N circular rows of positioning recesses are formed on concentric circles in the turntable. ICs to be tested are loaded into at least one of the N circular rows of positioning recesses at the IC loading angular position of the turntable, and when each of the loaded ICs to be tested makes a round to return to the original position of loading, it is crossed over to another row of positioning recesses, and after each of the loaded ICs to be tested has made at least one round, it is delivered to the testing section at the angular position of delivery of the turntable. If necessary, each of the loaded ICs to be tested may make further one or more rounds before it is delivered to the testing section at the angular position of delivery of the turntable. This means that each of the ICs to be tested carried by the turntable makes at least one revolution followed by a rotation from the cross-over position (which is the same as the IC loading angular position) to the delivery angular position whereby each of the ICs to be tested may be afforded an additional time required for movement through at least one revolution as compared with the prior art. Ample time is thus available for the IC to adequately take up the temperature in the constant temperature chamber. Accordingly, even if the turntable is rotated incrementally pitch by pitch in synchronism with the testing period in the testing section, it is possible to raise or lower the temperature of the IC to be tested to a designed temperature. It can thus be appreciated that the present invention provides the remarkable advantages that the number of ICs which can be tested per unit time may be increased and that the time required to conduct the testing may be reduced.

According to the second aspect of the present invention, each of the positioning recesses formed in the turntable is configured to accommodate and carry N ICs to be tested in the form of a vertical stack, so that the turntable is kept standing still during the time while N ICs in one vertical stack are tested in the testing section, whereby the time interval required to rotate the turntable by one pitch may be N times as long as the testing period in the testing section. Nevertheless, since the testing period for testing each IC in the testing section is the same as with the prior art, the number of ICs tested per unit time cannot be decreased, nor is the time required to conduct the testing elongated. In addition, the rotational speed of the turntable may be reduced so that ICs carried by the turntable may be adequately exposed to the temperature in the constant temperature chamber to insure that ICs to be tested are provided with temperature stress of a predetermined temperature.

While in the foregoing embodiments the present invention is described with respect to ICs representative of semiconductor devices, it is needless to say that the present invention is also applicable to semiconductor device transporting and handling apparatus for handling semiconductor devices other than ICs with equal functional effects.

What is claimed is:

1. An IC testing apparatus comprising:
   a constant temperature chamber comprising a soak stage, a testing section, and an unloading section;
   a contact arm transporting an object IC device to be tested from the soak stage to the testing section in which the object IC device is subjected to predetermined tests and then transporting the thus tested object IC device to the unloading section, said soak stage being supplied at a loading position with the object IC devices to be tested for applying a sufficient temperature stress to said object IC devices;
   a turntable comprising at least first and second concentric circular rows of positioning recesses spaced at equal angular intervals from adjacent recesses and provided in said soak stage to be intermittently rotated at said angular interval so as to circulate one after another of the positioning recesses of each of said first and second circular rows at a loading position, a delivering position and a transfer position in a circulate order;

loading means for successively loading the object IC devices one after another into one of the positioning recesses of the first circular row which locates at the loading position; and transfer means for transferring each of the object IC devices which has been carried in one of the positioning recesses of the first circular row on said turntable for substantially one revolution thereof to reach the transfer position that is equal to said loading position or slightly forwarded from the loading position in the circulate order into one of the positioning recesses of the second circular row at the transfer position;

whereby each one of said object IC devices transferred into said one of the positioning recesses of the second row is further rotated through a predetermined angle from the transfer position to the delivering position whereat each of said object IC devices is picked-up by said contact arm, so that the thus picked-up object IC device applied with a sufficient temperature stress while being retained on the turntable for more than one revolution thereof is transported to the test section.

2. The IC testing apparatus according to claim 1, which further comprises:

pick up means for successively picking up the object IC devices one after another from the positioning recess of the second row therewith each locating at the transfer position and for placing the thus picked up object device on the contact arm so as to be delivered to the test section.

3. The IC testing apparatus according to claim 1, which further comprises:

control means for controlling the loading means and the transfer means so as to set a timing of picking up by the transfer means of the one object IC device which has been carried in said positioning recess of said first row to reach said transfer position well before a timing of loading by the loading means of another one of the object IC devices from a storage tray.

4. An apparatus for testing ICs, said apparatus including a constant temperature chamber maintaining the ICs at a predetermined temperature and comprising:

a turntable provided in the constant temperature chamber and comprising at least two concentric circles of positioning recesses in which the ICs are placed;

a carrier arm placing the ICs respectively in the positioning recesses in one of the at least two concentric circles and moving the ICs to corresponding positioning recesses in another of the at least two concentric circles after a rotation of the turntable;

a contact arm located outside of the turntable and removing the ICs from the another of the at least two concentric circles.

5. A method for testing ICs in a constant temperature chamber, said method comprising the steps of:

placing the ICs respectively in positioning recesses formed in a first circle in a turntable provided within the constant temperature chamber; and moving, after a rotation of the turntable, the ICs into corresponding positioning recesses formed in a second circle concentric to the first circle in the turntable.

6. A method for testing integrated circuits comprising the steps of:

placing one of the integrated circuits into a positioning recess of a first row of positioning recesses in a turntable at an IC loading position in a constant temperature chamber;

intermittently rotating the turntable until the one of the integrated circuits held on the turntable reaches said IC loading position or a position in the vicinity and short thereof;

transferring the one of the integrated circuits from the positioning recess of the first row into a positioning recess of a second row of positioning recesses formed in concentric relation with said first row on said turntable; and then moving the one of the integrated circuits through an angle to a delivery position for delivery to a testing section within the constant temperature chamber.

7. A constant temperature chamber included in an apparatus testing integrated circuits, said constant temperature chamber comprising:

a loading section including a turntable which is intermittently rotated and provided with first and second concentric rows of positioning recesses to which the integrated circuits to be tested are successively supplied at an IC loading position;

means for crossing over each one of the integrated circuits held in each one of the positioning recesses of the first concentric row when said each one of the integrated [circuit] circuits reaches said IC loading position or a position in the vicinity and short thereof through one revolution of the turntable into each one of positioning recesses of the second concentric row;

a testing section for testing the integrated circuits; and a contact arm coupled to the turntable at a delivering position in the loading section for delivering the integrated circuits each retained in each of the positioning recesses of the second row through rotation of the turntable from the IC loading position to the delivering position into the testing section.

8. A method for transporting and handling semiconductor devices in a semiconductor device transporting and handling apparatus in which semiconductor devices stored in a tray are successively transferred at a semiconductor device loading position into a circular array of positioning recesses formed in a rotary type carrier means which in turn is intermittently rotated to transport the semiconductor devices held in said positioning recesses to a position adjacent to a testing section while the semiconductor devices are provided with a temperature stress of a predetermined temperature during the transportation by the carrier means, and in the position adjacent to said testing section, the semiconductor devices are successively delivered from said carrier means to said testing section to undergo a test, said positioning recesses being arranged in N circular rows lying on concentric circles on said rotary type carrier means, said method for transporting and handling semiconductor devices comprising the steps of:

intermittently rotating said rotary type carrier means;

loading the semiconductor devices from the tray into the positioning recesses of at least one of said N rows at the semiconductor device loading position;

crossing each of the loaded semiconductor devices, when it has reached said semiconductor device loading position or a position in the vicinity and short thereof with the intermittent rotation of said carrier means, over into one of the positioning recesses of another one of said N rows;

loading new semiconductor devices from the tray into the positioning recesses emptied by said cross-over of the semiconductor devices at said semiconductor device loading position; and delivering the semiconductor device having made at least one revolution with the intermittent rotation of said carrier means, when they are travelled to the position adjacent to said testing section, from said carrier means to said testing section.

9. The method according to claim 8, wherein said step of crossing is performed when each of the loaded semiconductor devices has reached said semiconductor device loading position with the intermittent rotation of said carrier means, and simultaneously therewith said step of successively loading new semiconductor devices is performed.

10. The method according to claim 8, wherein said step of crossing is performed when each of the loaded semiconductor devices has reached a position in the vicinity and short of said semiconductor device loading position with the intermittent rotation of said carrier means, and said step of successively loading new semiconductor devices is performed when the positioning recesses emptied by said cross-over of the semiconductor devices have reached said semiconductor device loading position.

11. The method according to claim 8, wherein said positioning recesses formed in said carrier means are arranged in two circular rows lying on concentric circles, and the semiconductor devices are successively loaded from the tray into the positioning recesses of the outer one of said two rows, and when each of the loaded semiconductor devices makes a round with the intermittent rotation of said carrier means, said semiconductor device is crossed over from said outer row into one of the positioning recesses of the inner one of said two rows, and the positioning recesses of said outer row emptied by said cross-over of the semiconductor devices are successively loaded with new semiconductor devices from the tray while the semiconductor devices having been crossed over into the positioning recesses of said inner row, followed by being travelled to the position adjacent to said testing section for delivery to said testing section.

12. The method according to claim 11, wherein the positioning recesses of said inner row have a depth greater than that of the positioning recesses of said outer row.

13. The method according to claim 8, wherein the positioning recesses of each of said rows are formed at angular intervals of about 12°, there being an angular interval of about 240° between the angular position where the semiconductor devices are successively loaded into said positioning recesses on said carrier means and the angular position where the semiconductor devices are successively delivered to said testing section.

14. A method for transporting and handling semiconductor devices in a semiconductor device transporting and handling apparatus in which semiconductor devices stored in a tray are successively transferred at a semiconductor device loading position into a circular array of positioning recesses formed in a rotary type carrier means which in turn is intermittently rotated to transport the semiconductor devices held in said positioning recesses to a position adjacent to a testing section while the semiconductor devices are provided with a temperature stress of a predetermined temperature during the transportation by the carrier means, and in the position adjacent to said testing section, the semiconductor devices are successively delivered from said carrier means to said testing section to undergo a test, each of said positioning recesses being made sufficiently deep to accommodate a plurality of semiconductor devices in a vertical stack, an elevator means being disposed in the bottom of each of said positioning recesses for vertically moving the semiconductor devices stacked one on another, drive means being disposed at the semiconductor device loading position and at the position adjacent to the testing section, said drive means being adapted to drive each elevator means so as to be able to stop it at positions corresponding in number to the semiconductor devices stacked one on another, said method for transporting and handling semiconductor devices comprising the steps of:

intermittently rotating said rotary type carrier means;

loading the semiconductor devices from the tray into the positioning recesses with a plurality of semiconductor devices in a vertical stack for each positioning recess at the semiconductor device loading position;

delivering the uppermost one of the stacked semiconductor devices loaded in one of the positioning recesses from said carrier means to said testing section at the position adjacent to said testing section, when they are travelled to the position adjacent to said testing section;

driving the drive means disposed at the position adjacent to the testing section to raise the corresponding elevator means for moving up the remaining semiconductor device or devices in said one positioning recess; and repeating said step of delivering the upper most one of the stacked semiconductor devices and said step of driving the drive means disposed at the position adjacent to the testing section until the stacked semiconductor devices in said one positioning recess is emptied.

15. The method according to claim 14, wherein each of said positioning recesses has a depth sufficient to accommodate two semiconductor devices, and each of said elevator means is mounted in the bottom of the associated positioning recess for vertically upward and downward movements between two positions of upper and lower levels, and each of said drive means is adapted to drive said elevators such that at said semiconductor device loading position the elevator is first raised by the associated drive means to said upper level position, and upon a first semiconductor device being loaded into the associated positioning recess, said elevator is lowered to said lower level position, and that at said position adjacent to the testing section, after the upper one of the stacked semiconductor devices is picked up from the associated positioning recess, said elevator is raised by the associated drive means to said upper level position.

16. The method according to claim 15, wherein when each of said elevator means is lowered from said upper level position to said lower level position, it is allowed to descend by virtue of its own weight without being driven by the associated drive means.

17. A semiconductor device transporting and handling apparatus in which semiconductor devices stored in a tray are successively transferred at a semiconductor device loading position into a circular array of positioning recesses formed in a rotary type carrier means which in turn is intermittently rotated to transport the semiconductor devices held in said positioning recesses to a position adjacent to a testing section while the semiconductor devices are provided with a temperature stress of a predetermined temperature during the transportation by the carrier means, and in the position adjacent to said testing section, the semiconductor devices are successively delivered from said carrier means to said testing section to undergo a test, said positioning recesses formed in said turntable being arranged in N circular rows lying on concentric circles, said apparatus comprising:

- means for successively loading the semiconductor devices from the tray into the positioning recesses of at least one of said N rows at the semiconductor device loading position;
- means for crossing each of the loaded semiconductor devices, when it has reached said semiconductor device loading position or a position in the vicinity and short thereof with the intermittent rotation of said carrier means, over into one of the positioning recesses of another one of said N rows, said successively loading means loading new semiconductor devices from the tray into the positioning recesses of said one row emptied by said cross-over of the semiconductor devices at said semiconductor device loading position; and
- means for delivering the semiconductor devices having been transferred into the positioning recesses of said another one row by said crossing means and made at least one revolution with the intermittent rotation of said carrier means, when they are traveled to the position adjacent to said testing section, from said carrier means to said testing section.

18. The apparatus according to claim 17, wherein said rotary type carrier means is a turntable on which said positioning recesses are arranged in two circular rows lying on concentric circles, and the semiconductor devices are successively loaded from the tray into the positioning recesses of the outer one of said two rows, and when each of the loaded semiconductor devices makes a round with the intermittent rotation of said turntable, said semiconductor device is crossed over from said outer row into one of the positioning recesses of the inner one of said two rows, and the positioning recesses of said outer row emptied by said cross-over of the semiconductor devices are successively loaded with new semiconductor devices from the tray while the semiconductor devices having been crossed over into the positioning recesses of said inner row, followed by being travelled to the position adjacent to said testing section for delivery to said testing section.

19. The apparatus according to claim 18, wherein the positioning recesses of said inner row have a depth greater than that of the positioning recesses of said outer row.

20. The apparatus according to claim 17, wherein the positioning recesses of each of said rows are formed at angular intervals of about 12°, there being an angular interval of about 240° between the angular position where the semiconductor devices are successively loaded into said positioning recesses on said carrier means and the angular position where the semiconductor devices are successively delivered to said testing section.

21. A semiconductor device transporting and handling apparatus in which semiconductor devices stored in a tray are successively transferred at a semiconductor device loading position into positioning recesses formed in a rotary type carrier means which in turn is intermittently rotated to transport the semiconductor devices held in said positioning recesses to a position adjacent to a testing section while the semiconductor devices are provided with a temperature stress of a predetermined temperature during the transportation by the carrier means, and in the position adjacent to said testing section, the semiconductor devices are successively delivered from said carrier means to said testing section to undergo a test, said apparatus comprising:

- a circular array of positioning recesses formed in said rotary type carrier means, each of said positioning recesses having a depth to sufficiently accommodate a plurality of semiconductor devices in a vertical stack;
- elevator means being disposed in the bottom of each of said positioning recesses for vertically moving the semiconductor devices stacked one on another;
- drive means being disposed at the semiconductor device loading position and at said position adjacent to the testing section, each of said drive means being adapted to drive the corresponding one of said elevators so as to be able to stop it at positions corresponding in number to the semiconductor devices stacked one on another; and
- control means for controlling each of said elevator means at said semiconductor device loading position to move it by the associated drive means to a predetermined position so as to maintain constant the distance of downward travel that the semiconductor devices drop into said positioning recesses, and each of said elevator means at said position adjacent to said testing section to move it by the associated drive means to a predetermined position so as to permit a pick-up means to pick up the semiconductor devices always at the level of the uppermost one of the stacked semiconductor devices in each of said positioning recesses.

22. The method according to claim 21, wherein each of said positioning recesses has a depth sufficient to accommodate two semiconductor devices, and each of said elevator means is mounted in the bottom of the associated positioning recess for vertically upward and downward movements between two positions of upper and lower levels, and each of said drive means is adapted to drive said elevator means such that at said semiconductor device loading position, each elevator means is first raised by the associated drive means to said upper level position, and upon a first semiconductor device being loaded into the associated positioning recess, said elevator means is lowered to said lower level position, and that at said delivery position, after the upper one of the stacked semiconductor devices is picked up from the associated positioning recess, said elevator means is raised by the associated drive means to said upper level position.

23. The apparatus according to claim 22, wherein when each of said elevator means is lowered from said upper level position to said lower level position, it is allowed to descend by virtue of its own weight without being driven by the associated drive means.

* * * * *